United States Patent [19]

Presser

[11] Patent Number: 4,556,856

[45] Date of Patent: Dec. 3, 1985

[54] PLANAR, LUMPED ELEMENT, MATCHED N-WAY POWER DIVIDER

[75] Inventor: Adolph Presser, Kendall Park, N.J.

[73] Assignee: RCA Corporation, Princeton, N.J.

[21] Appl. No.: 651,845

[22] Filed: Sep. 18, 1984

[51] Int. Cl.[4] .......................... H03H 7/48; H01P 5/12
[52] U.S. Cl. .................................. 333/124; 333/128; 333/23; 333/140
[58] Field of Search ................. 333/23, 124, 125, 126, 333/127, 128, 129, 136, 138, 140, 132, 134

[56] References Cited

U.S. PATENT DOCUMENTS

| | | |
|---|---|---|
| 3,091,743 | 5/1963 | Wilkinson . |
| 3,436,687 | 4/1969 | Andrews, Jr. et al. ............. 333/140 |
| 3,701,056 | 10/1972 | Ozawa et al. . |
| 3,904,990 | 9/1975 | La Rosa .......................... 333/125 X |

FOREIGN PATENT DOCUMENTS 2404573 8/1975 Fed. Rep. of Germany ...... 333/128

OTHER PUBLICATIONS

Webb, Power Divider/Combiners Small Siz, Big Specs, Microwaves, Nov. 1981, pp. 67–74.
Cox, Phasing Networks for Broadcast Arrays, Electronics, Jun. 1944.

Primary Examiner—Paul Gensler
Attorney, Agent, or Firm—Joseph S. Tripoli; Robert L. Troike; Robert Ochis

[57] ABSTRACT

An N-way, lumped element, matched, isolated branch power divider in planar form is disclosed. Lumped inductors are disposed on the top surface of a dielectric substrate, an isolation resistor network is disposed on the bottom surface of the substrate and the substrate is suspended above a ground conductor by lumped element capacitors. The capacitance values of the capacitors and the inductance values of the inductors are selected to provide between the common terminal and each branch terminal a lumped element $\pi$ network transmission line having a phase shift of about 90° at frequencies within an operating range of frequencies.

13 Claims, 9 Drawing Figures

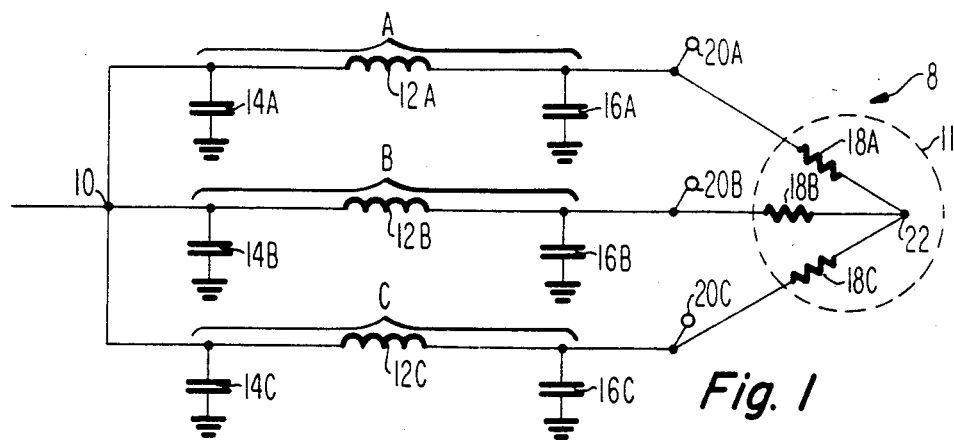
Fig. 1
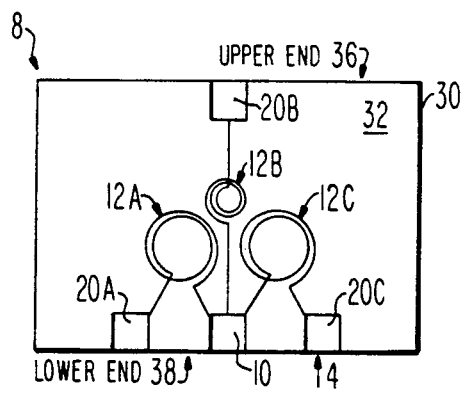
Fig. 2
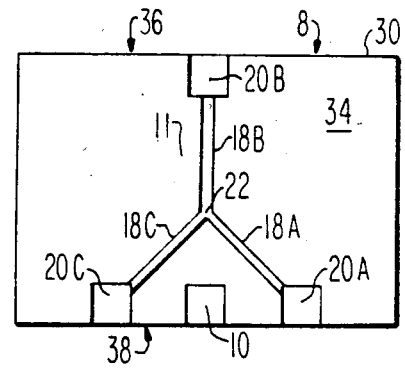
Fig. 3
Fig. 4
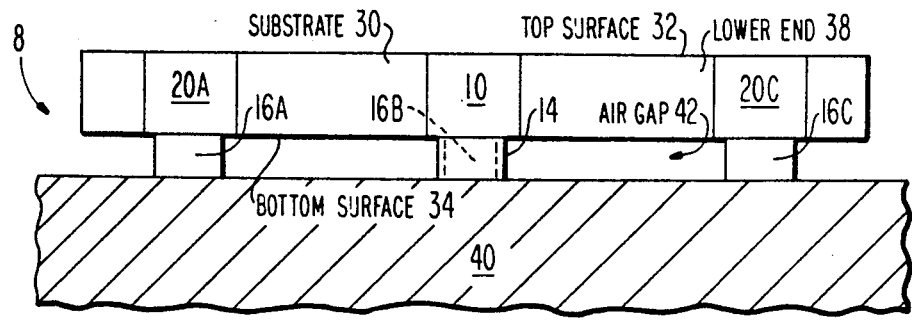

PLANAR, LUMPED ELEMENT, MATCHED N-WAY POWER DIVIDER

The present invention relates to power dividers and more particularly to power dividers in a lumped element and planar form having two or more branch terminals.

N-way, matched, isolated, branch waveguide power dividers in cylindrical form are disclosed in U.S. Pat. No. 3,091,743 to Wilkinson. These power dividers are commonly referred to as Wilkinson dividers after their inventor. In the cylindrical form disclosed by Wilkinson the value of N can be any integer greater than 1. For the equal power division case which is illustrated and described in the Wilkinson Patent, each of the branch lines is identical and they are uniformly distributed about the cylinder. Isolation resistors are arranged in a star network in which each resistor has one end connected to a common (floating) point and the other end connected to a different one of the branch lines one quarter wavelength along the branch transmission line from the common junction of that branch line with the other branch lines. The resistor network is disposed in a plane which is perpendicular to the axis of the cylinder. The result is a power divider having a structure which is "symmetric" in the sense that the environment around each branch is the same.

When N is 2, the two resistors connecting the branch lines to the common point reduce to a single resistor whose midpoint constitutes the common point. Such a structure is easily fabricated in a planar symmetrical form. Planar implementations of Wilkinson power dividers when N is greater than 2, require that the conductors connecting the isolation resistors to the branch terminals cross over the branch lines. This complicates both the design and the fabrication of the power dividers, destroys the "symmetry" of the power divider and introduces parasitic effects which cause performance deterioration.

In many circuits for satellites and other applications where small size and lightweight are critical, matched power dividers of the Wilkinson type are needed. In many of these circuits 3-way dividers are needed. Such circuits are usually fabricated in an integrated or monolithic form to save space and weight. The use of a waveguide divider structure to provide power division or combination conflicts with the desire for lightweight and small size. As a result, there is a need for matched N-way power dividers in a compact planar form with isolation among the branch ports.

SUMMARY OF THE INVENTION

The present invention fulfills the need for compact, matched, N-way power dividers through use of lumped element $\pi$ network equivalents of quarter wavelength transmission lines. A dielectric substrate has N inductors disposed on its first surface. Each inductor is connected between a different one of N branch terminals and a common terminal. A separate capacitor connects each terminal to a ground conductor which is disposed in fixed, spaced relation to the substrate. The values of the inductors and capacitors are selected to provide between the common terminal and each of the N branch terminals a lumped element $\pi$ network transmission line having a phase shift of about 90° at frequencies within the power divider's operating frequency range. If it is desired to have the branch terminals isolated, an isolation resistor network is connected to all of the branch terminals. When there are more than two branch terminals, this isolation resistor network is disposed on the second side of the substrate.

BRIEF DESCRIPTION OF THE DRAWINGS

FIG. 1 is a schematic diagram of the equivalent circuit of a three-way, equal-phase, equal-power power divider in accordance with the present invention;

FIGS. 2 and 3 are plan views of the top and bottom surfaces, respectively, of a substrate on which some lumped elements of the FIG. 1 circuit are disposed;

FIG. 4 is an end view of the assembled structure in the direction of arrow 4 in FIG. 2;

DETAILED DESCRIPTION OF THE PREFERRED EMBODIMENT

Figure 5:
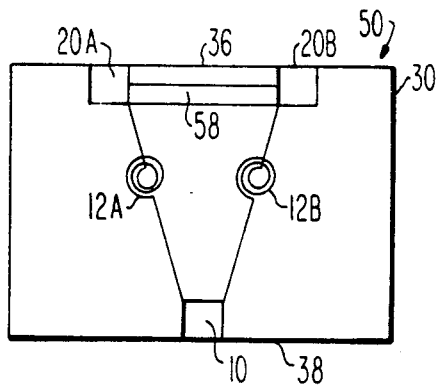
FIGS. 5 and 6 are plan views of the top and bottom surfaces, respectively, of a substrate having thereon a two-way equal-power power divider in accordance with the invention.
Figure 6:
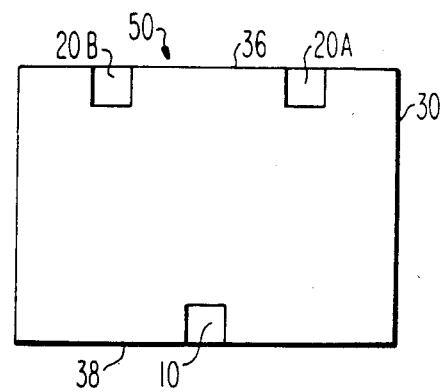

A schematic diagram of the equivalent circuit of a three-way matched power divider 8 is presented in FIG. 1. This power divider has a common terminal 10 and three branch terminals 20A, 20B and 20C. Branch terminal 20A is connected to common terminal 10 by an artifical transmission line A. The branch terminals 20B and 20C, are connected to common terminal 10 in a similar manner by artifical transmission lines B and C, respectively.

This structure is called a power divider in accordance with industry practice. When the common terminal 10 is connected to a source of an input signal and the branch terminals 20A, 20B and 20C, are connected to load circuits, circuit 8, in fact serves to divide the input power equally among the branch terminals in amplitude and with equal phase. When the branch terminals 20A, 20B and 20C are connected to sources of input signals with equal phase and the common terminal 10 is connected to a load circuit, then the circuit 8 functions as a power combiner.

The transmission line A is in the form of a lumped element $\pi$ network equivalent of a distributed transmission line. This lumped element equivalent has an inductor 12A connected in series between its common terminal end and its branch terminal end. A capacitor 14A is connected between the common terminal end of inductor 12A and ground. A second capacitor 16A is connected at the branch terminal 20A end of inductor 12A to ground. The capacitors 14A and 16A preferably have the same capacitance value. The values of the inductance 12A and the capacitances 14A and 16A are selected such that an impedance transformation and a phase shift of 90° from terminal 10 to terminal 20A are provided near the center of the desired operating frequency range of the power divider 8 in accordance with the well known design techniques for $\pi$ networks.

The artifical transmission lines B and C are electrically identical to the transmission line A. The lines B and C have their components identified by the same reference numerals except for the use of suffixes B and C to identify the transmission line of which they form a part.

In order to make the power divider 8 a matched power divider, with isolation between individual branch terminals or ports, an isolation resistor network 11 is connected to the terminals 20. Network 11 comprises three resistors, a resistor 18A connected to branch terminal 20A, a resistor 18B connected to branch terminal 20B, and a resistor 18C connected to branch terminal 20C. The other ends of the resistors 18A, 18B and 18C, are connected together at a common floating point 22.

In actual fabrication of this power divider, the three capacitors 14A, 14B and 14C which are connected in parallel in the schematic circuit diagram of FIG. 1 are combined into a single capacitor 14 (FIG. 4) having a capacitance which is the sum of the capacitances of the individual capacitors 14A, 14B and 14C.

Each of the $\pi$ networks produces an impedance transformation and a 90° phase shift near the center of its designed frequency range as a ¼ wavelength transmission line does. For this reason the use of these lumped element $\pi$ network equivalent transmission lines satisfies the Wilkinson design criteria of ¼ wavelength transmission line impedance transformers between the common junction of the branch lines (terminal 10) and the point at which the isolation resistor connects to a branch line.

A physical implementation of the divider 8 with isolation among the branch terminals is illustrated in FIGS. 2, 3 and 4. The lumped inductors 12A, 12B and 12C are formed on the top surface 32 of a dielectric substrate 30. The resistors 18A, 18B and 18C of network 11 are formed on the bottom surface 34 of the substrate 30. The substrate 30 is suspended above a planar ground conductor by the capacitors 16A, 16B, 16C and the combined capacitor 14 as shown in FIG. 4 where capacitor 16B is shown in phantom because it is directly behind capacitor 14.

In FIG. 2, the common terminal 10 is in the center near the lower end 38 of the substrate. The branch terminal 20A, is toward the left near substrate end 38, the branch terminal 20B is in the center near the upper end 36 of the substrate and branch terminal 20C is toward the right near the substrate end 38. Each of the inductors 12A, 12B and 12C, is implemented in the form of a spiral printed on the top surface 32 of the substrate and connected between the common terminal 10 and that inductor's associated branch terminal. In each inductor the jumper conductor which connects the inner end of its spiral to the conductor to a branch terminal is preferably deposited separately from the rest of the inductor and is insulated from the crossing conductor(s) of the spiral by a dielectric layer.

In FIG. 3, the substrate 30 is flipped over so the branch terminal 20A is in the lower right and the branch terminal 20C is in the lower left. The branch terminals extend from top surface 32 to bottom surface 34 of substrate 30.

The resistors 18A, 18B and 18C, are printed directly on the substrate's bottom surface 34. One end of each resistor is connected to its associated branch terminal 20A, 20B or 20C. The other ends of the resistors 18A, 18B and 18C are joined together at the common point 22 which is equidistant from the terminals. The resistances of resistors 18A, 18B and 18C are made equal. Other resistor networks which meet the requirements for proper operation may be used. The values of the resistors are selected in accordance with the terminating impedances of the divider system. In the present system, 50 ohm resistors are used since the system is designed with 50 ohm terminating impedances.

The portion of each of the terminals 10, 20A, 20B and 20C, on the bottom surface 34 of the substrate 30 is made electrically continuous with the portion on the top surface 32 by forming each of the terminals as a conductor which extends along the lower surface 34, up the vertical edge surface and onto the upper surface 32. Such terminals may be formed by evaporation or printing in accordance with fabrication preferences. Alternatively this electrical continuity can be provided by plated through holes in the substrate or other techniques for providing connections through the substrate. Such alternative techniques are particularly useful where the power divider is distant from the edges of the substrate.

Referring to FIG. 4 substrate 30 is spaced from a ground conductor 40 by the capacitors 14, 16A, 16B and 16C in chip form at the respective terminals 10, 20A, 20B and 20C which wrap around the end surface of the substrate. A chip capacitor is a common microwave component which is a rectangular solid having the capacitor's electrodes as two of its faces which are parallel and spaced apart by the thickness of the capacitor's dielectric. The other faces of the solid are coated with a passivating dielectric. Chip capacitors come in a number of sizes. One of these sizes is about 15 mils by 15 mils by 7 mils thick (0.038 cm by 0.038 cm by 0.018 cm thick). Such chip capacitors are available from a number of vendors, including American Technical Ceramics of Huntington, N.Y. There is an air gap 42 between the dielectric substrate 30 and the ground conductor 40. The substrate 30 is secured to the ground conductor 40 in this configuration by soldering each chip capacitor's lower electrode to the ground conductor 40 and its upper electrode to that capacitor's associated terminal on the bottom surface 34 of substrate 30. The far end 36 of the substrate (hidden in FIG. 4) is spaced from and secured to the ground plane 40 by the chip capacitor 16B (shown by dashed lines) which is connected between the ground conductor 40 and branch terminal 20B. In this construction the physical capacitors 16A, 16B, 16C and 14 serve the dual purpose of providing the electrical capacitance needed for the lumped element $\pi$ network transmission line equivalents and also provide the structural support for securing the substrate 30 in fixed, suspended relation with respect to the ground conductor 40.

Where the divider 8 is to operate in a frequency range of 1000 MHz to 1200 MHz with a center frequency of 1100 MHz, each of the inductors has a 10.6 nh (nanohenry) inductance. The inductors are formed of 2 mil (0.005 cm) wide conductive copper lines deposited in spirals with a 2 mil (0.005 cm) separation. The conductor end which crosses the spiral to reach its terminal is insulated from the crossed conductors by a 0.1 mil (2.5 μm) thick layer of silicon nitride dielectric. The spirals which form the inductor 12A and 12C have relatively large diameters (60 mils (0.15 cm)) and 1.8 turns. The spiral which forms the inductor 12B has a relatively small diameter (40 mils (0.1 cm)) and 2.5 turns. These differing configurations are selected for fabrication convenience and each has the same inductance.

Each of the capacitors 16 has a 1.4 pF (pico Farad) capacitance. The capacitor 14 has a capacitance of 4.2 pF. All of the capacitors are chip capacitors each of which is 7 mils (0.018 cm) thick. This establishes an air gap 42 which is 7 mils (0.018 cm) thick. The substrate 30 is 25 mil (0.064 cm) thick alumina (Al₂O₃) which is 0.236 inch (0.6 cm) long from end 36 to end 38 and 0.4 inch (1.0 cm) wide. Each of the resistors is a 50 ohm resistor. The ground conductor is as long as the substrate and wider than the substrate to provide a flange for securing the overall divider to a larger structure.

In the frequency range from 1000 MHz to 1200 MHz this voltage divider exhibits a maximum voltage standing wave ratio (VSWR) of 1.35:1, an isolation between branch ports of better than 20 dB and a 2° maximum deviation from equal phase among the branch ports.

Although this power divider is fabricated utilizing lumped inductors and capacitors, the air gap 42 and the dielectric 30 are thin enough that distributed effects should be taken into account in selecting the lumped component values for the capacitors and the shape (number of turns and diameter) of the inductors. This is so that the lumped elements actually used and the distributed effects present will combine to yield the desired actual inductance and capacitance values. As indicated, it is preferred to have an air dielectric filling the space between the substrate 30 and the ground conductor 40 however, other dielectrics may be used if any resulting difference in distributed effects is taken into account in selecting the shape of the spiral inductors.

In this specific design for operation at the specified frequency with the lumped element values indicated, the inductors must be on the surface of the substrate which is away from the ground conductor. This interposes the dielectric of the substrate between the inductors and the ground conductor. If it were desired to invert the substrate so that the resistors were on the surface away from the ground conductor and the inductors were on the surface toward the ground conductor, then the distributed capacitances between the inductors and the ground conductor would change and the inductor shape would have to be changed to maintain the required inductance.

In the illustrated, three-way, equal-power power divider, each of the lumped artifical transmission lines has a characteristic impedance of $50\sqrt{3}$ ohms in order that all four ports of the divider will match to 50 ohms. If it is desired to make this lumped element divider produce unequal power division or to match different port terminations, then the characteristic impedance of the different branch lines is changed in accordance with standard power divider design practice. For example, increasing the characteristic impedance of two of the lines while reducing the characteristic impedance of the other line to maintain the match at the common terminal causes the reduced impedance line to take more than one third of the power.

Thus, lumped element power dividers in accordance with the present invention can be designed to accomplish anything which a distributed power divider can be designed to accomplish.

This lumped element three-way power divider improves over prior art distributed transmission line dividers in several areas. It solves the problem of how to place and connect the isolation resistors without the use of crossovers while retaining similar environments for all of the lines. It also reduces the size and weight of the power divider. The three-way divider 8 was fabricated on a substrate whose area is only about ten percent of the area required to fabricate a two-way power divider using distributed transmission line techniques at the same frequency.

A two-way power divider using this lumped element technique can be fabricated in an even smaller area. Such a two-way power divider 50 is illustrated in FIGS. 5 and and 6. Divider 50 has two branch terminals 20A and 20B at the upper end 36 of substrate 30 and the common terminal 10 at its lower end 38. The isolation resistor network reduces to a single resistor 58 which is connected directly between the two branch terminals 20A and 20B. The resistor 58 is shown disposed on the top substrate surface 32 along with the inductors 12A and 12B since this two-branch case does not require crossovers when fabricated in a single plane. However, resistor 58 can be placed on the bottom surface 34 if desired.

Figure 7:
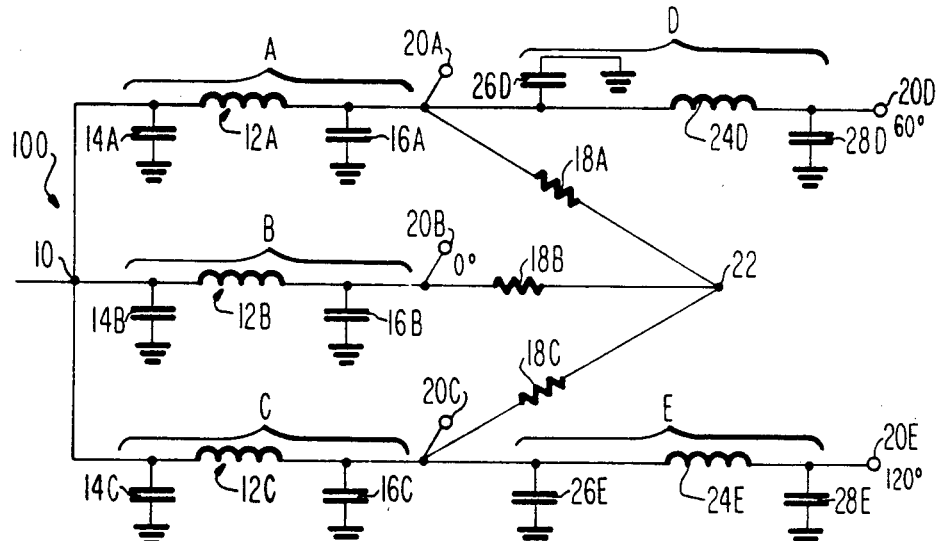
FIG. 7 is a schematic illustration of a three-way, equal-power power divider in accordance with the present invention which provides outputs at relative phases of 0°, 60° and 120°.

FIG. 7 is a schematic illustration of the equivalent circuit of a three-way, non-equal-phase power divider 100 in accordance with the present invention. Power divider 100 has a common terminal 10 and branch terminals 20B, 20D and 20E, having relative phases of 0°, 60° and 120°. Power divider 100 includes the three-way power divider 8 of FIGS. 1 through 4, an additional lumped element $\pi$ network transmission line D in series between the terminal 20A of divider 8 and terminal 20D and a second similar $\pi$ network in series between the terminal 20C of divider 8 and terminal 20E.

The artifical transmission line D includes an inductor 24D connected in series between terminals 20A and 20D, a capacitor 26D connected between terminal 20A and ground, and a capacitor 28D connected between terminal 20D and ground. In a similar manner, the artifical transmission line E includes an inductor 24E connected in series between terminals 20C and 20E, a capacitor 26E connected between terminal 20C and ground, and a capacitor 28E connected between terminal 20E and ground. The inductors 24D and 24E generally have different inductances. However, for the special case of 60° phase differences between individual output ports they both have the same inductance. The capacitors 26D and 28D are selected with different capacitances than the capacitors 26E and 28E in order to cause a different effective capacitive reactance value and thus phase delay for each of the transmission lines D and E in the operating frequency range of the divider 100.

It is desired to provide signals at terminal 20B with a 0° relative phase, those at terminal 20D with a 60° relative phase delay and those at terminal 20E with a 120° relative phase delay. In order to achieve this at the 1100 MHz center frequency of the divider 8, the inductors 24D and 24E are fabricated with inductances of 5.3 nh, the capacitors 26D and 28D have values of 1.4 pF and the capacitors 26E and 28E have values of 4.2 pF. Since the capacitor 26D and the capacitor 16A are electrically connected in parallel, in actual fabrication they are combined into a single capacitor having a capacitance equal I to their sum and connected at terminal 20A. In a similar manner, the capacitor 16C and the capacitor 26E are combined into a single capacitor and connected at terminal 20C.

Figure 8:
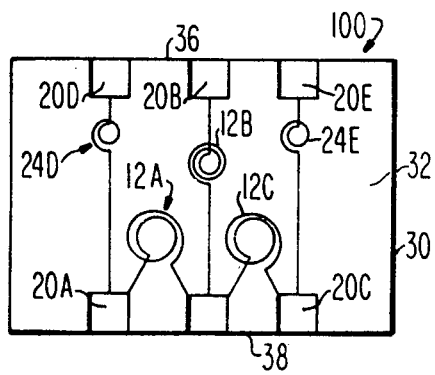
FIGS. 8 and 9 are plan views of the top and bottom surfaces, respectively, of the substrate of the FIG. 7 divider.

FIG. 8 is a plan view of the top surface 32 of the substrate 30 having the non-equal-phase power divider 100 fabricated thereon. The inductor 24D is fabricated as a 1.5 turn spiral connected between the terminal 20A at the lower lefthand part of the substrate and the terminal 20D at the upper lefthand part of the substrate. In a similar manner, the inductor 24E is fabricated as a 1.5 turn spiral connected between the terminal 20C at the lower right of the substrate and the terminal 20E at the upper right of the substrate.

Figure 9:
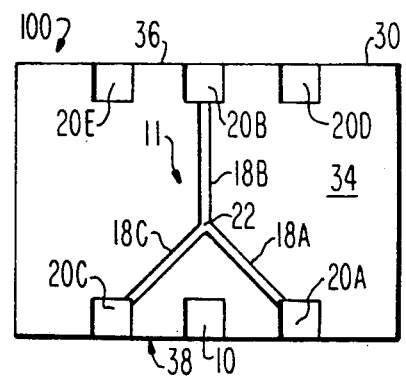

FIG. 9 is a plan view of the bottom surface 34 of the substrate 30 of non-equal-phase power divider 100. This surface differs from that of FIG. 3 only in the presence of the additional terminals 20D and 20E.

During assembly capacitor 28D is positioned between the terminal 20D and the ground conductor and the capacitor 28E is positioned between the terminal 20E and the ground conductor. In this manner, the substrate 30 is suspended above the ground plane 40 at 6 points rather than the 4 points present in divider 8. Naturally, if desired, the divider 8 could be suspended at the same 6 points since the presence of capacitors at terminals 20D and 20E would have no effect on the operation of the power divider 8 in the absence of connections between the terminals 20D and 20E and the rest of the power divider.

What is claimed is:

1. An N-way power divider for operation over a range of frequencies, comprising:
    a dielectric substrate having first and second opposed major surfaces;
    a common terminal and N branch terminals disposed on said substrate;
    a ground conductor disposed in fixed, spaced relation to said substrate;
    N inductors disposed on said first surface of said substrate, each connected between said common terminal and a different one of said N branch terminals;
    N capacitors each connected between said ground conductor and a different one of said N branch terminals;
    a capacitor connected between said ground conductor and said common terminal; and
    the capacitance value of said N capacitors and said capacitor connected to said common terminal and the inductance value of said N inductors being selected to provide between said common terminal and each of said N branch terminals a lumped element $\pi$ network transmission line having a phase shift of about 90° at frequencies within said operating range of frequencies.

2. The power divider recited in claim 1 wherein all of said capacitors are chip capacitors which have a first electrode secured to said ground conductor and a second electrode secured in fixed relation to said substrate and in electrical communication with said terminal to which it is connected whereby the physical structure of said capacitors supports said substrate in fixed relation to said ground conductor.

3. The power divider recited in claim 2 further comprising:
    an isolation resistor network disposed on said second surface of said substrate and connected to each of said N branch terminals.

4. The power divider recited in claim 3 wherein:
    N is 3;
    each of said inductors has substantially the same inductance;
    each of said N capacitors has substantially the same capacitance; and
    said capacitor connected to said common terminal has a capacitance value which is substantially three times the capacitance value of one of said N capacitors whereby said power divider is an equal-phase, equal-power power divider.

5. The power divider recited in claim 4 wherein said second surface of said substrate is disposed toward said ground conductor.

6. The power divider recited in claim 5 wherein:
    said inductors are in the form of printed inductors printed directly on said first surface of said substrate; and
    said resistors are in the form of printed resistors printed directly on said second surface of said substrate.

7. The matched power divider recited in claim 3 wherein said resistor network comprises N resistors each connected between a common point and one of said N branch terminals.

8. A three-way power divider for operation over a range of frequencies comprising:
    a dielectric substrate having first and second opposed major surfaces;
    a common terminal and first, second and third branch terminals disposed on said substrate;
    a ground conductor disposed in fixed, spaced relation to said substrate;
    first, second and third inductors disposed on said first surface of said substrate and connected between said common terminal and said first, second and third branch terminals, respectively;
    first, second and third isolation resistors disposed on said second surface of said substrate and connected between a common point and said first, second and third branch terminals, respectively;
    first, second and third capacitors each connected between said ground conductor and said first, second and third branch terminals, respectively;
    a capacitor connected between said ground conductor and said common terminal; and
    the capacitance value of said first, second, and third capacitors and said capacitor connected to said common terminal and the inductance values of said first, second and third inductors being selected to provide between said common terminal and each of said branch terminals a lumped element, $\pi$ network, transmission line having a phase shift of about 90° at frequencies within said operating range of frequencies.

9. The three-way power divider recited in claim 8 further comprising:
    fourth and fifth branch terminals;
    a fourth inductor connected between said first branch terminal and said fourth branch terminal;
    a fifth inductor connected between said third branch terminal and said fifth branch terminal;
    a fourth capacitor connected between said fourth branch terminal and ground;
    a fifth capacitor connected between said fifth branch terminal and ground;
    the inductance value of said fourth inductor, and the capacitance value of said fourth capacitor and said first capacitor being selected to provide a signal at said fourth branch terminal with a delay of about 60° relative to the signal at said second branch terminal within said operating range of frequencies; and
    the inductance value of said fifth inductor, and the capacitance values of said fifth capacitor and said third capacitor being selected to provide a signal at said fifth branch terminal with a delay of about 120° relative to the signal at said second branch terminal within said operating range of frequencies.

10. The power divider recited in claim 8 wherein:
the inductance values of said first, second and third inductors are substantially equal;
the capacitance values of said first, second and third capacitors are substantially equal; and
the capacitance value of said capacitor connected to said common terminal is substantially equal to the sum of said first, second and third capacitance values whereby said power divider provides equal-phase, equal-power outputs.

11. The power divider recited in claim 9 wherein each of said capacitors is a chip capacitor secured to both said substrate and said ground conductor whereby the physical structure of said capacitors supports said substrate in fixed relation to said ground conductor.

12. A two-way power divider for operation over a range of frequencies comprising:
a dielectric substrate having first and second opposed major surfaces;
a common terminal and first and second branch terminals disposed on said substrate;
a ground conductor disposed in fixed, spaced relation to said substrate;
first and second inductors disposed on said first surface of said substrate and connected between said common terminal and said first and second branch terminals, respectively;
an isolation resistor disposed on said substrate and connected between said first and second branch terminals;
first and second capacitors, each connected between said ground conductor and said first and second branch terminals, respectively; and
a capacitor connected between said ground conductor and said common terminal;
the inductance value of said first and second inductors and the capacitance values of said first and second capacitors and said capacitor connected to said common terminal being selected to provide between said common terminal and each of said branch terminals a lumped element, $\pi$ network transmission line having a phase shift of about 90° at frequencies within said operating range of frequencies.

13. The two-way power divider recited in claim 12 wherein said isolation resistor is disposed on said first surface of said substrate.

* * * * *